(12) United States Patent
Choi et al.

(10) Patent No.: US 11,974,388 B2
(45) Date of Patent: Apr. 30, 2024

(54) CIRCUIT BOARD

(71) Applicant: LG INNOTEK CO., LTD., Seoul (KR)

(72) Inventors: Byeong Kyun Choi, Seoul (KR); Min Young Hwang, Seoul (KR); Hyun Gu Im, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 171 days.

(21) Appl. No.: 17/310,657

(22) PCT Filed: Feb. 13, 2020

(86) PCT No.: PCT/KR2020/002041
§ 371 (c)(1),
(2) Date: Aug. 16, 2021

(87) PCT Pub. No.: WO2020/166996
PCT Pub. Date: Aug. 20, 2020

(65) Prior Publication Data
US 2022/0132653 A1    Apr. 28, 2022

(30) Foreign Application Priority Data

Feb. 15, 2019   (KR) .................. 10-2019-0017578

(51) Int. Cl.
*H05K 1/03*    (2006.01)
*H05K 1/02*    (2006.01)

(52) U.S. Cl.
CPC ......... *H05K 1/0237* (2013.01); *H05K 1/0298* (2013.01); *H05K 1/0306* (2013.01); *H05K 1/036* (2013.01); *H05K 2201/09481* (2013.01)

(58) Field of Classification Search
CPC .... H05K 1/0237; H05K 1/0306; H05K 1/036; H05K 1/0243; H05K 1/0366;
(Continued)

(56) References Cited

U.S. PATENT DOCUMENTS 5,436,279 A  *  7/1995  Grundke ................. C08L 63/10
                                                      522/100
7,277,055 B2    10/2007  Tamaoka
(Continued)

FOREIGN PATENT DOCUMENTS

CN      102548183 A    7/2012
CN      102548184 A    7/2012
(Continued)

OTHER PUBLICATIONS

English Translation JP 2018-133416; Watanabe et al. Ajinomoto Co. Published Aug. 23, 2018 (Year: 2018).*
(Continued)

*Primary Examiner* — Steven T Sawyer
(74) *Attorney, Agent, or Firm* — SALIWANCHIK, LLOYD & EISENSCHENK

(57) ABSTRACT

A circuit board, according to an embodiment, comprises: a first insulating layer; a second insulating layer disposed on one surface of the first insulating layer; and a third insulating layer disposed on the other surface of the first insulating layer. A circuit pattern is disposed on at least one insulating layer from among the first to third insulating layers, at least one insulating layer from among the first to third insulating layers comprises glass fiber, at least one insulating layer from among the first to third insulating layers does not comprise glass fiber, and the thicknesses of the first to third insulating layers are different from each other.

12 Claims, 5 Drawing Sheets

(58) Field of Classification Search
CPC ........ H05K 1/181; H05K 3/282; H05K 3/284;
H05K 3/323; H05K 3/3436; H05K
3/4682; H05K 2201/0338; H05K
2201/0347; H05K 2201/09481; H05K
1/0298
See application file for complete search history.

(56) References Cited

U.S. PATENT DOCUMENTS

| | | | |
|---|---|---|---|
| 11,026,327 B2 | 6/2021 | Shin | |
| 2003/0090883 A1 | 5/2003 | Asahi et al. | |
| 2004/0160751 A1* | 8/2004 | Inagaki | H01L 21/4857 |
| | | | 257/E23.079 |
| 2005/0108874 A1* | 5/2005 | Lee | H05K 1/162 |
| | | | 438/109 |
| 2006/0102383 A1* | 5/2006 | Cha | H05K 3/4602 |
| | | | 174/262 |
| 2007/0117261 A1* | 5/2007 | Ueno | H05K 3/4691 |
| | | | 438/106 |
| 2008/0038523 A1 | 2/2008 | Kim et al. | |
| 2008/0264684 A1* | 10/2008 | Kang | H05K 3/428 |
| | | | 174/250 |
| 2011/0232085 A1* | 9/2011 | Muramatsu | H05K 3/0032 |
| | | | 29/846 |
| 2012/0085572 A1* | 4/2012 | Sakai | H01L 23/5389 |
| | | | 29/829 |
| 2015/0041184 A1* | 2/2015 | Nam | H05K 1/115 |
| | | | 174/251 |
| 2015/0257262 A1* | 9/2015 | Lee | H05K 1/0366 |
| | | | 174/251 |
| 2016/0007442 A1* | 1/2016 | Schönholz | B32B 37/02 |
| | | | 428/457 |
| 2016/0079149 A1* | 3/2016 | Yoshida | H05K 3/241 |
| | | | 174/257 |
| 2020/0205284 A1 | 6/2020 | Shin | |

FOREIGN PATENT DOCUMENTS

| | | |
|---|---|---|
| CN | 108676533 A | 10/2018 |
| JP | 2000-255001 A | 9/2000 |
| JP | 2002-299839 A | 10/2002 |
| JP | 2004-152935 A | 5/2004 |
| JP | 2005-50885 A | 2/2005 |
| JP | 2010-10329 A | 1/2010 |
| JP | 2011-3884 A | 1/2011 |
| JP | 2013-153213 A | 8/2013 |
| JP | 2016-42536 A | 3/2016 |
| JP | 2016-115753 A | 6/2016 |
| JP | 2017-61120 A | 3/2017 |
| JP | 2017-73460 A | 4/2017 |
| JP | 2018-133416 A | 8/2018 |
| JP | 2018-137252 A | 8/2018 |
| KR | 10-2006-0013950 A | 2/2006 |
| KR | 10-2006-0102341 A | 9/2006 |
| KR | 10-2008-0020936 A | 3/2008 |
| KR | 10-2015-0098908 A | 8/2015 |
| KR | 10-2017-0059286 A | 5/2017 |
| WO | 2019/022580 A1 | 1/2019 |

OTHER PUBLICATIONS

English Translation JP2010010329; Kyocera SLC Technologies; Published Jan. 14, 2010 (Year: 2010).*
English Translation JP2016115753, Hiromasa et al. Fujitsu Ltd; Published Jun. 23, 2016 (Year: 2016).*
English Translation JP2018133416, Watanabe et al., Ajinomoto Co Inc, (Year: 2018).*
Office Action dated Jul. 26, 2022 in Japanese Application No. 2021-544589.
Office Action dated Jan. 24, 2023 in Japanese Application No. 2021-544589.
Supplementary European Search Report dated Dec. 13, 2022 in European Application No. 20755358.7.
International Search Report dated Jun. 9, 2020 in International Application No. PCT/KR2020/002041.
Office Action dated Mar. 15, 2023 in Chinese Application No. 202080014762.0.
Office Action dated Aug. 8, 2023 in Japanese Application No. 2021-544589.

* cited by examiner

CIRCUIT BOARD

CROSS-REFERENCE TO RELATED APPLICATIONS

This application is the U.S. national stage application of International Patent Application No. PCT/KR2020/002041, filed Feb. 13, 2020, which claims the benefit under 35 U.S.C. § 119 of Korean Application No. 10-2019-0017578, filed Feb. 15, 2019, the disclosures of each of which are incorporated herein by reference in their entirety.

TECHNICAL FIELD

The present invention relates to a circuit board.

BACKGROUND ART

A printed circuit board (PCB) is formed by printing a circuit line pattern at an electrical insulating substrate with a conductive material such as copper, and thus the PCB refers to a board just before electronic components are mounted thereon. That is, in order to densely mount various types of electronic components on a planar surface, the PCB refers to a circuit board having a planar surface on which a mounting position of each component is fixed and a circuit pattern connecting the components is fixedly printed.

In general, as a surface processing method for a circuit pattern included in the above-described PCB, an organic solderability preservative (OSP) method, an electrolytic nickel/gold method, an electrolytic nickel/gold-cobalt alloy method, an electroless nickel/palladium/gold method, etc. are used.

In this case, the above-described surface processing methods vary depending on a use thereof, and the use includes, for example, soldering, wire bonding, and a connector.

Components mounted on the printed circuit board may transmit signals generated from the components by circuit patterns connected to the components.

Meanwhile, recently, with advancement of functionality in portable electronic devices and the like, high-frequency of signals are in progress in order to perform high-speed processing of a large amount of information, and a circuit pattern of a printed circuit board suitable for high-frequency applications is required.

Such a circuit pattern of a printed circuit board is required to reduce transmission loss in order to enable transmission without deteriorating the quality of high frequency signals.

The transmission loss of the circuit pattern of the printed circuit board mainly consists of conductor loss due to a copper foil and dielectric loss due to an insulator.

Meanwhile, as a thickness of the insulator increases, dielectric loss between an upper circuit and a lower circuit of the insulator decreases. In this case, there is a problem that the overall thickness of the circuit board increases.

In addition, when an insulator having a low dielectric constant is used, strength of the insulator decreases, and thus there is a problem that the reliability of the circuit board is deteriorated.

Therefore, there is a need for a printed circuit board of a new structure having a sufficient strength while including an insulator having a low dielectric constant suitable for transmitting a high frequency signal.

DISCLOSURE

Technical Problem

An embodiment is directed to providing a circuit board having a low dielectric constant while maintaining rigidity.

Technical Solution

A circuit board according to an embodiment includes: a first insulating layer; a second insulating layer disposed on one surface of the first insulating layer; and a third insulating layer disposed on the other surface of the first insulating layer, wherein a circuit pattern is disposed on at least one insulating layer of the first insulating layer to the third insulating layer, at least one insulating layer of the first insulating layer to the third insulating layer includes glass fiber, at least one insulating layer of the first insulating layer to the third insulating layer does not include glass fiber, and thicknesses of the first insulating layer to the third insulating layer are different from each other.

Advantageous Effects

A circuit board according to an embodiment may include a plurality of insulating layers having different dielectric constants, strengths, thicknesses, and curing characteristics.

Accordingly, since the plurality of insulating layers have a low dielectric constant, it is possible to reduce transmission loss according to the dielectric constant when transmitting a high frequency signal. In addition, it is possible to implement a thin circuit board by reducing by reducing the thickness of the insulating layer. Further, the plurality of insulating layers have the low dielectric constant and at the same time satisfies the strength, so that the reliability of the circuit board may be improved.

In addition, a photocurable insulating layer may be formed on the outermost layer of the circuit board to form the circuit pattern in a buried pattern. Therefore, it is possible to implement a fine pattern and reduce the thickness of the circuit board.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a circuit board according to an embodiment will be described with reference to drawings.

Figure 1:
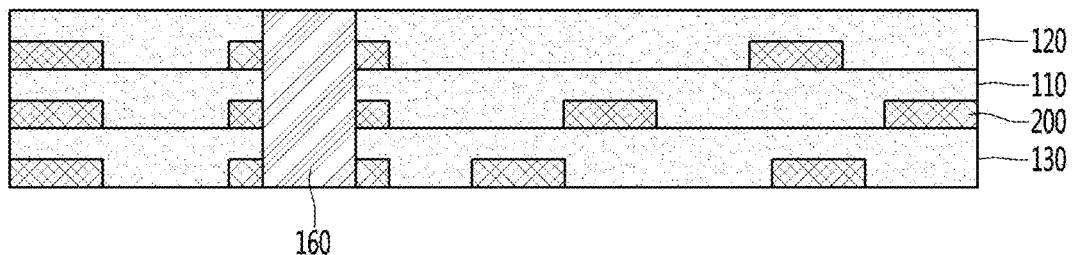
FIG. 1 is a view illustrating a cross-sectional view of a circuit board according to an embodiment.

Referring to FIG. 1, a circuit board according to an embodiment may include a first insulating layer 110, a second insulating layer 120, and a third insulating layer 130. For example, the first insulating layer 110 may be a central insulating layer, the second insulating layer 120 may be an upper insulating layer disposed on the first insulating layer 110, and the third insulating layer 130 may be a lower insulating layer disposed under the first insulating layer 110.

The first insulating layer 110, the second insulating layer 120, and the third insulating layer 130 are substrates on which an electric circuit capable of changing wirings is disposed, respectively and may include all of printing, a wiring plate, and an insulating substrate which are made of an insulating material which is able to form a circuit pattern 200 at a surface of each of the insulating layers.

At least one of the first insulating layer 110, the second insulating layer 120, and the third insulating layer 130 may be rigid or flexible. For example, at least one of the first insulating layer 110, the second insulating layer 120, and the third insulating layer 130 may include glass or plastic.

Specifically, at least one of the first insulating layer 110, the second insulating layer 120, and the third insulating layer 130 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, at least one of the first insulating layer 110, the second insulating layer 120, and the third insulating layer 130 may include an optically isotropic film. For example, at least one of the first insulating layer 110, the second insulating layer 120, and the third insulating layer 130 may include cyclic olefin copolymer (COC), cyclic olefin polymer (COP), optically isotropic PC, optically isotropic polymethylmethacrylate (PMMA), etc.

Further, at least one of the first insulating layer 110, the second insulating layer 120, and the third insulating layer 130 may be partially bent while having a curved surface. That is, the insulating layers may partially have a plane and may partially be bent while having a curved surface. Specifically, an end portion of at least one of the first insulating layer 110, the second insulating layer 120, and the third insulating layer 130 may be bent while having a curved surface, or bent or crooked while having a surface with a random curvature.

Furthermore, at least one of the first insulating layer 110, the second insulating layer 120, and the third insulating layer 130 may be a flexible substrate having flexibility. Further, at least one of the first insulating layer 110, the second insulating layer 120, and the third insulating layer 130 may be a curved or bent substrate. In this case, the insulating layers may represent a wiring layout for electrical wirings which connect circuit components based on a circuit design, and electrical conductors may be disposed on an insulating material. Furthermore, electrical components may be mounted on the first insulating layer 110, the second insulating layer 120, and the third insulating layer 130, and the first insulating layer 110, the second insulating layer 120, and the third insulating layer 130 may form wirings configured to connect the electrical components to make a circuit and may mechanically fix the components besides functioning to electrically connect the components.

Meanwhile, the first insulating layer 110, the second insulating layer 120, and the third insulating layer 130 may include different materials. That is, each insulating material constituting the first insulating layer 110, the second insulating layer 120, and the third insulating layer 130 may be made of different materials.

In detail, the first insulating layer 110, the second insulating layer 120, and the third insulating layer 130 may include different materials in consideration of the dielectric constant and rigidity of the circuit board.

In addition, the first insulating layer 110, the second insulating layer 120, and the third insulating layer 130 may have different sizes. That is, the first insulating layer 110, the second insulating layer 120, and the third insulating layer 130 may have different thicknesses.

In detail, the first insulating layer 110, the second insulating layer 120, and the third insulating layer 130 may be formed with different thicknesses in consideration of the dielectric constant and rigidity of the circuit board.

Materials and thicknesses of the insulating layers will be described in detail below.

Each of the circuit patterns 200 is disposed at surfaces of the first insulating layer 110, the second insulating layer 120, and the third insulating layer 130. The circuit pattern 200 may be a wiring for transmitting an electrical signal, and may be formed of a metal material having high electrical conductivity. To this end, the circuit pattern 200 may be formed of at least one metal material selected from among gold (Au), silver (Ag), platinum (Pt), titanium (Ti), tin (Sn), copper (Cu), and zinc (Zn).

In addition, the circuit pattern 200 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern 200 may be formed of copper (Cu) having high electrical conductivity and a relatively low cost.

The circuit pattern 200 may be formed by a general process of manufacturing a PCB, such as an additive process, a subtractive process, a modified semi additive process (MSAP), a semi additive process (SAP), etc., and detailed descriptions thereof will be omitted herein.

At least one via 160 is formed in at least one of the first insulating layer 110, the second insulating layer 120, and the third insulating layer 130. The via 160 is disposed passing through at least one of the plurality of insulating layers. The via 160 may pass through only one of the plurality of insulating layers, and alternatively, may be formed to commonly pass through at least two insulating layers of the plurality of insulating layers. Accordingly, the via 160 electrically connects circuit patterns disposed at surfaces of different insulating layers to each other.

The via 160 may be formed by filling, with a conductive material, a through hole (not shown) passing through at least one of the plurality of insulating layers.

The through hole may be formed by any one of mechanical, laser, and chemical processing. When the through hole is formed by mechanical processing, a method such as milling, drilling and routing may be used. When the through hole is formed by laser processing, a method of UV or $CO_2$ laser may be used, and when the through hole is formed by chemical processing, the insulating layers may be opened by using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through hole is formed, the via 160 is formed by filling the inside of the through hole with a conductive material. The metal material forming the via 160 may be anyone selected from among copper (Cu), silver (Ag), tin (Sn), gold (Au), nickel (Ni), and palladium (Pd). The conductive material may be filled by any one of electroless plating, electrolytic plating, screen printing, sputtering, evaporation, ink jetting, and dispensing, or a combination thereof.

As described above, the first insulating layer 110, the second insulating layer 120, and the third insulating layer 130 may include different materials.

For example, the first insulating layer 110, the second insulating layer 120, and the third insulating layer 130 may include materials having different dielectric constants.

That is, the first insulating layer 110 may include a material having a high dielectric constant compared to the second insulating layer 120 and the third insulating layer 130, and the second insulating layer 120 may include a material having a high dielectric constant compared to the third insulating layer 130.

In addition, the first insulating layer 110, the second insulating layer 120, and the third insulating layer 130 may include materials having different rigidities.

That is, the third insulating layer 130 may include a material having rigidity compared to the first insulating layer 110 and the second insulating layer 120, and the second insulating layer 120 may include a material having rigidity compared to the first insulating layer 110.

The first insulating layer 110 may include prepreg including glass fiber. In detail, the first insulating layer 110 may include an epoxy resin and a material in which glass fiber and a silicon-based filler are dispersed in the epoxy resin.

In addition, the second insulating layer 120 may include a photocurable resin. In detail, the second insulating layer 120 may include a photocurable resin that does not include glass fiber. For example, the second insulating layer 120 may include an acrylic resin, a photoinitiator, a silicon-based filler, and a hardener.

In addition, the third insulating layer 130 may not include glass fiber. In detail, the third insulating layer 130 may include resin coated Cu (RCC). RCC is a resin coated on a copper foil without glass fiber and does not include glass fiber, so that the dielectric constant of the insulating layer may be reduced.

That is, the first insulating layer 110 includes glass fiber, and the second insulating layer 120 and the third insulating layer 130 do not include glass fiber.

Since an epoxy resin constituting the insulating layer has a problem of low mechanical strength, the glass fiber included inside the insulating layer is included in the insulating layer, and the strength of the insulating layer may be improved by a crosslinking role.

However, the glass fiber or the acrylic resin may be a factor that increases the dielectric constant of the insulating layer. In detail, a dielectric constant (Dk) of the glass fiber is about 4.6 to about 6.6, and accordingly, in case of the insulating layer including the glass fiber or the acrylic resin, the overall dielectric constant of the insulating layer may be increased by the inherent dielectric constant of the glass fiber itself.

Accordingly, when all insulating layers including glass fiber are used as the insulating layer of the circuit board, the dielectric constant of the circuit board is increased, and thus, there is a problem that signal loss increases due to the dielectric constant when the circuit board is used to transmit a high-frequency signal.

In addition, when an insulating layer having a small dielectric constant is used, signal loss due to the dielectric constant can be reduced, but there is a problem in that the reliability of the circuit board is deteriorated due to the low insulating layer strength.

Accordingly, the circuit board according to the embodiment may solve the above problems by manufacturing a circuit board using insulating layers including different materials having low dielectric constant and high strength.

In detail, the dielectric constant (Dk) of the third insulating layer 130 not including glass fiber and acrylic resin may have a dielectric constant of 70% to 85% of the dielectric constant (Dk) of the first insulating layer 110 and the second insulating layer 120 including glass fiber or acrylic resin.

As an example, the dielectric constants (Dk) of the first insulating layer 110 and the second insulating layer 120 including glass fiber or acrylic resin may be about 3.6 to about 3.8. In addition, the dielectric constant (Dk) of the third insulating layer 130 not including glass fiber and acrylic resin may be about 3.0 or less.

That is, the dielectric constants of the second insulating layer 120 and the third insulating layer 130 not including glass fiber may be smaller than the dielectric constant of the first insulating layer 110 including glass fiber.

In addition, strength of the first insulating layer 110 including glass fiber is greater than strengths of the second insulating layer 120 and the third insulating layer 130 because the glass fiber serves to complement the strength of the insulating layer inside the insulating layer.

That is, when the circuit board is formed only with the first insulating layer including glass fiber, strength of the circuit board is 12 MPa to 20 MPa, so that the strength of the circuit board is guaranteed, and even when the first insulating layer including the glass fiber and the second and third insulating layers not including glass fiber are used together, the strength of the circuit board is 8 MPa to 10 MPa, and thus the strength of the circuit board may not be significantly affected.

In conclusion, the first insulating layer 110 may have improved characteristics in terms of strength compared to the second insulating layer 120 and the third insulating layer 130, and the third insulating layer 130 may have improved characteristics in terms of dielectric constant compared to the first insulating layer 110 and the second insulating layer 120. In addition, the second insulating layer 120 has a relatively high dielectric constant and a relatively low strength, but may have photocurable characteristics unlike the other insulating layers.

That is, the circuit board according to the embodiment includes a plurality of insulating layers having different characteristics in terms of strength, dielectric constant, etc., thereby improving both the dielectric constant and strength of the circuit board.

That is, it is possible to reduce signal loss due to an increase in the dielectric constant when transmitting a high frequency signal by reducing the dielectric constant of the circuit board compared to the circuit board including only the first insulating layer including glass fiber. In addition, it is possible to inhibit the deformation of the circuit board and the deterioration of the characteristics due to a decrease in strength by increasing the strength compared to the circuit board including only the second insulating layer and/or the third insulating layer not including glass fiber.

Meanwhile, in the foregoing description, it was described as an example that the first insulating layer is a central insulating layer, the second insulating layer is an upper insulating layer, and the third insulating layer is a lower insulating layer, but the embodiment is not limited thereto, and the first insulating layer may be an upper or lower insulating layer, the second insulating layer may be a lower or central insulating layer, or the third insulating layer may be an upper or central insulating layer.

That is, the circuit board according to the embodiment extends from the third insulating layer toward the second insulating layer and the dielectric constant is changed, and in this case, the first insulating layer, the second insulating layer, and the third insulating layer may be disposed to be stacked so that the dielectric constant is increased while extending from the third insulating layer toward the second insulating layer, or the dielectric constant is decreased while extending from the third insulating layer toward the second insulating layer, or the dielectric constant is decreased and then increased while extending from the third insulating layer toward the second insulating layer, or the dielectric constant is increased or decreased while extending from the third insulating layer toward the second insulating layer.

Figure 2:
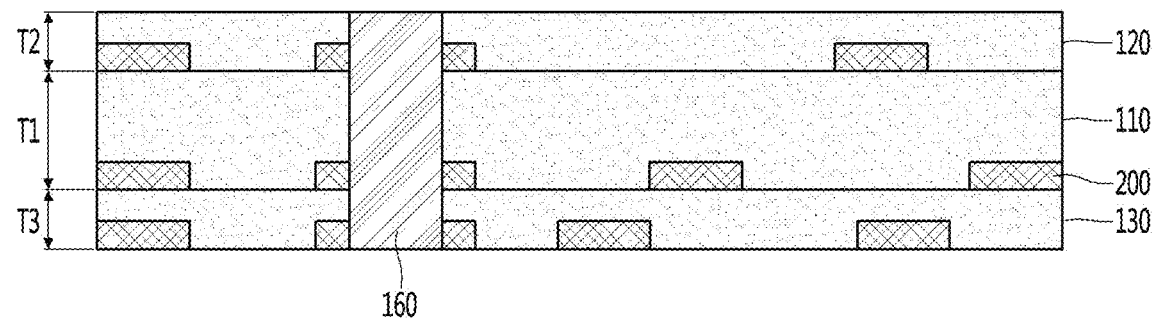
FIG. 2 is a view illustrating another cross-sectional view of a circuit board according to an embodiment.

Meanwhile, referring to FIG. 2, thicknesses of the first insulating layer 110, the second insulating layer 120, and the third insulating layer 130 may be different from each other.

In detail, a first thickness T1 of the first insulating layer 110 and a second thickness T2 of the second insulating layer 120 may be greater than a third thickness T3 of the third insulating layer 130.

That is, the first thickness T1 of the first insulating layer 110 and the second thickness T2 of the second insulating layer 120 that include glass fiber or an acrylic resin may be greater than the third thickness T3 of the third insulating layer 130 that does not include glass fiber.

That is, the first thickness T1 of the first insulating layer 110 and the second thickness T2 of the second insulating layer 120 that have a high dielectric constant may be greater than the third thickness T3 of the third insulating layer 130 having a relatively small dielectric constant.

For example, the third thickness T3 of the third insulating layer 130 may be formed in a size of about 70% to 85% with respect to the thickness the first thickness T1 of the first insulating layer 110 and the second thickness T2 of the second insulating layer 120.

When the third thickness T3 of the third insulating layer 130 is formed to be less than about 70% or more than about 85% with respect to the first thickness T1 of the first insulating layer 110 and the second thickness T2 of the second insulating layer 120, the dielectric constant of the third insulating layer is increased, and thus transmission characteristics may be deteriorated when transmitting a high frequency signal.

Accordingly, when manufacturing a multilayer circuit board, it is possible to reduce the thickness of the insulating layer while having a low dielectric constant, thereby forming a circuit board having a low dielectric constant and a thin thickness as a whole and having rigidity.

Meanwhile, as described above, the second insulating layer 120 may include a photocurable resin. In detail, referring to FIG. 3, the second insulating layer 120 formed on the uppermost or lowermost portion of the insulating layer may include the photocurable resin.

Circuit patterns may be formed on each of the plurality of insulating layers. In detail, a first circuit pattern 210 may be formed on the first insulating layer 110, a second circuit pattern 220 may be formed on the second insulating layer 120, and a third circuit pattern 230 may be formed on the third insulating layer 130.

Accordingly, the second circuit pattern 220, which is the outermost circuit pattern formed on the second insulating layer 120, may be formed as a buried pattern buried in the surface of the insulating layer rather than a protruding pattern protruding above the surface of the insulating layer.

That is, since the second insulating layer 120 includes the photocurable resin, a plurality of grooves in which a circuit pattern is formed may be formed on one surface of the second insulating layer 120 through exposure, development, and etching processes using UV light, and the circuit pattern may be formed by filling the inside of the grooves with a material constituting the circuit pattern.

Therefore, since the second circuit pattern 220 is formed as the buried pattern rather than the protruding pattern, a thickness of the circuit board may be reduced as much as a thickness of the pattern. In addition, a circuit pattern having a fine line width may be implemented using a photoresist process.

In addition, since the second insulating layer 120 includes a photocurable resin having properties similar to those of a solder resist and the outermost circuit pattern is buried in the insulating layer, a passivation layer such as a solder resist protecting a surface of the outermost circuit pattern may be removed, and accordingly, an entire thickness of the printed circuit board may be reduced as much as a thickness of the passivation layer.

Meanwhile, a pad portion may be formed above the second insulating layer and below the third insulating layer, respectively.

Figure 4:
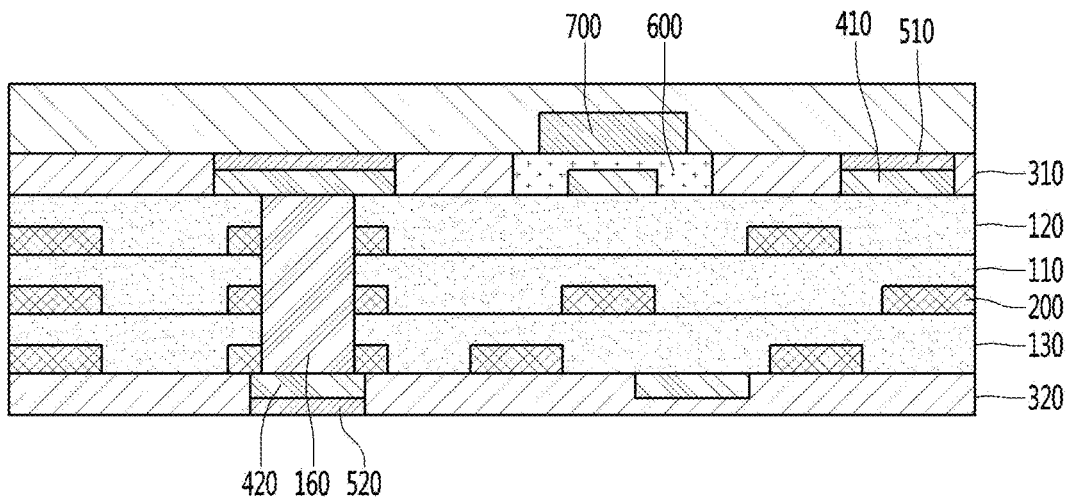
FIG. 4 is a view illustrating yet another cross-sectional view of a circuit board according to an embodiment.

Referring to FIG. 4, a first pad 410 is disposed on the second insulating layer 120, and a second pad 420 is disposed under the third insulating layer 130.

In other words, the first pad 410 is disposed on the uppermost insulating layer in which the electronic component 700 is to be formed, among the plurality of insulating layers. The first pad 140 may be formed in plural on the uppermost insulating layer. For example, the first pad 410 may serve as a pattern for signal transmission.

In addition, the second pad 420 is disposed under the lowermost insulating layer to which an external substrate (not shown) is to be attached, among the plurality of insulating layers. Like the first pad 410, a portion of the second pad 420 may serve as a pattern for signal transmission.

In addition, the first upper metal layer 510 is disposed on the first pad 410, and the second upper metal layer 520 is disposed under the second pad 420. The first upper metal layer 510 and the second upper metal layer 520 may be formed of the same material and may increase soldering characteristics while protecting the first pad 410 and the second pad 420, respectively.

To this end, the first upper metal layer 510 and the second upper metal layer 520 are formed of a metal including gold (Au). Preferably, the first upper metal layer 510 and the second upper metal layer 520 may include only pure gold (purity of 99% or more), or alternatively, may be formed of an alloy including gold (Au).

When the first upper metal layer 510 and the second upper metal layer 520 are formed of the alloy including gold, the alloy may be formed of a gold alloy including cobalt.

A solder paste 600 may be disposed on the uppermost insulating layer among the plurality of insulating layers. The solder paste 600 may be an adhesive for fixing the electronic component 700. The adhesive may be a conductive adhesive, or alternatively, the adhesive may be a non-conductive adhesive.

The conductive adhesive is largely classified into an anisotropic conductive adhesive and an isotropic conductive adhesive, and is basically composed of conductive particles such as Ni, Au/polymer, or Ag, and thermosetting and thermoplastic resins, or a blend type insulating resin mixing characteristics of the two resins.

In addition, the non-conductive adhesive may also be a polymeric adhesive and may preferably be a non-conductive polymer adhesive including a thermosetting resin, a thermoplastic resin, a filler, a curing agent, and a curing accelerator.

Further, a first passivation layer 310, through which at least a part of a surface of the first upper metal layer 510 is exposed, is disposed on the uppermost insulating layer. The first passivation layer 310 is disposed to protect the surface of the uppermost insulating layer, and, for example, may be a solder resist.

The electronic component 700 may include both a device and a chip. The device may be classified into an active device and a passive device. The active device refers to a device that positively uses non-linear characteristics. The passive device refers to a device that does not use non-linear characteristics even though both linear and non-linear characteristics are present. In addition, the active device may include a transistor, an IC semiconductor chip, and the like and the passive device may include a condenser, a resistor, an inductor, and the like. The passive device is mounted on a substrate together with an ordinary semiconductor package in order to increase a signal processing speed of a semiconductor chip which is an active device, perform a filtering function, or the like.

As a result, the electronic component 700 may include all of a semiconductor chip, a light emitting diode chip, and other driving chips.

In addition, a resin molding part may be formed on the uppermost insulating layer, and accordingly, the electronic component 700 and the first upper metal layer 510 may be protected by the resin molding part.

Meanwhile, the second passivation layer 320 is disposed under the lowermost insulating layer among the plurality of insulating layers. The second passivation layer 320 has an opening exposing a surface of the second upper metal layer 520. The second passivation layer 320 may be formed of a solder resist.

An adhesive member for soldering may be disposed under the second upper metal layer 520 exposed through an opening of the second passivation layer 320.

The adhesive member provides an adhesive force between the circuit board and the external substrate, and the adhesive member may be formed of a solder ball, or alternatively may be formed by using an adhesive paste or a copper core solder ball.

In addition, the adhesive paste may be formed of a conductive material for electrical conduction, and in this case, when the adhesive paste is formed of the conductive material, the adhesive paste may preferably be formed of a conductive material selected from the group consisting of copper, silver, gold, aluminum, carbon nanotubes, and combinations thereof.

As described above, the circuit board according to the embodiment may include a plurality of insulating layers having different dielectric constants, strengths, thicknesses, and curing characteristics.

Accordingly, since the plurality of insulating layers have a low dielectric constant, it is possible to reduce transmission loss according to the dielectric constant when transmitting a high frequency signal. In addition, it is possible to implement a thin circuit board by reducing by reducing the thickness of the insulating layer. Further, the plurality of insulating layers have the low dielectric constant and at the same time satisfies the strength, so that the reliability of the circuit board may be improved.

In addition, the photocurable insulating layer may be formed on the outermost layer of the circuit board to form the circuit pattern in the buried pattern. Therefore, it is possible to implement a fine pattern and reduce the thickness of the circuit board.

Hereinafter, a circuit board according to another embodiment will be described with reference to FIGS. 5 to 12. In the description of the circuit board according to another embodiment, descriptions of the same and similar descriptions as those of the circuit board according to the above-described embodiment are omitted, and the same reference numerals are assigned to the same components.

Figure 5:
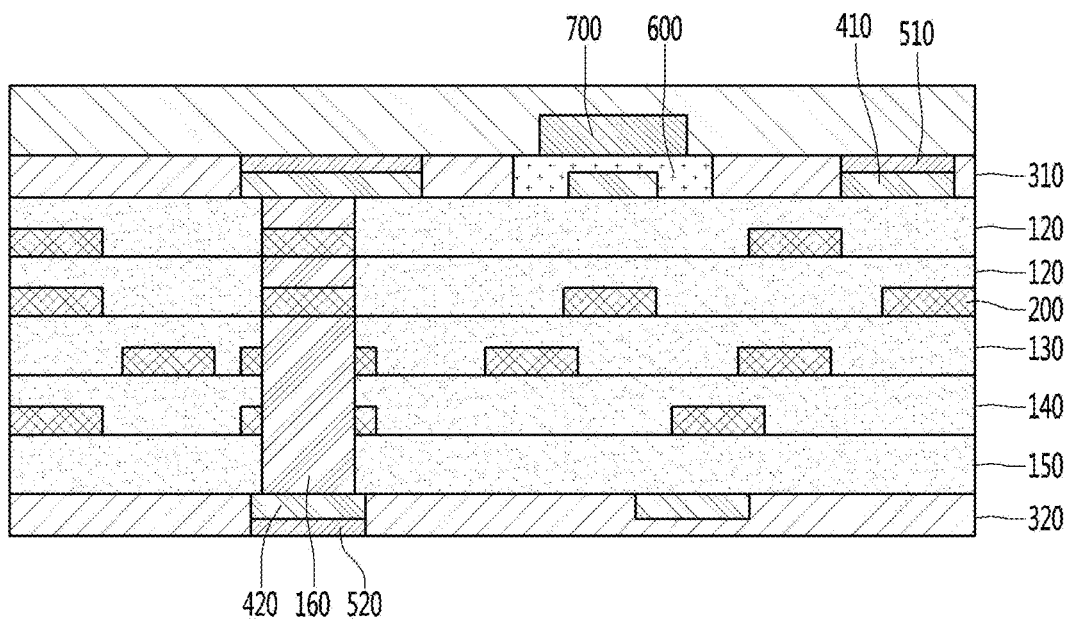
FIG. 5 is a view illustrating a cross-sectional view of a circuit board according to another embodiment.

Referring to FIG. 5, the circuit board according to another embodiment may be a multilayer circuit board. In detail, the circuit board according to another embodiment may be a circuit board on which a circuit pattern of five layers or more is formed, and accordingly, the circuit board may further include a fourth insulating layer and a fifth insulating layer.

That is, the circuit board according to another embodiment may be a system in package (SIP), that is, a circuit board in which a large number of circuit patterns are required because a plurality of chips are mounted on the circuit board.

Referring to FIGS. 6 to 12, a circuit board according to another embodiment may be formed by the following process.

Figure 6:
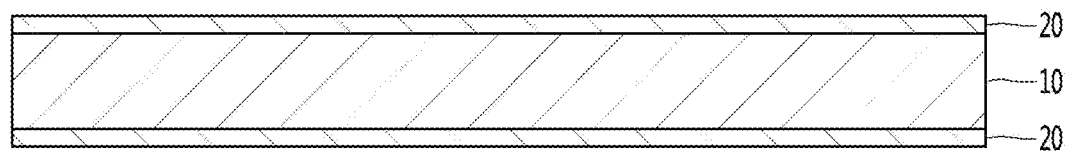
FIGS. 6 to 12 are views for describing a method of manufacturing a circuit board according to another embodiment in order of processes.

Referring to FIG. 6, referring to FIG. 2, first, a carrier board for manufacturing a first insulating part is prepared. The carrier board may be a substrate that is a basis for manufacturing a circuit board. The carrier board may have a structure in which metal layers 20 are formed on both sides of a support substrate 10.

The carrier board is a general support substrate, and may use a copper clad laminate (CCL).

Meanwhile, a surface of the metal layer 20 of the carrier board may be surface-treated to facilitate separation from the first insulating part later.

Figure 7:
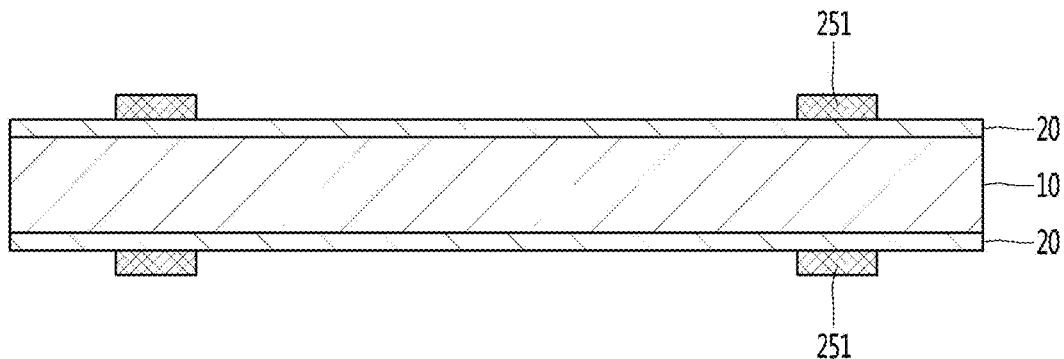

Next, referring to FIG. 7, a circuit pattern is formed on the carrier board. That is, a fifth circuit pattern 251 may be formed on the carrier board. The fifth circuit pattern 251 may be respectively formed on both surfaces of the carrier board CB.

The fifth circuit pattern 251 may be formed by plating a metal material on the metal layer 20 with the metal layer 20 as a seed layer. Alternatively, the fifth circuit pattern 251 may be formed by forming a plating layer (not shown) on the metal layer 20 and etching the formed plating layer.

The fifth circuit pattern 251 may be formed of at least one metal material selected from among gold (Au), silver (Ag), platinum (Pt), titanium (Ti), tin (Sn), copper (Cu), and zinc (Zn). In addition, a first circuit pattern 105 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the first circuit pattern 105 may be formed of copper (Cu) having high electrical conductivity and a relatively low cost.

The fifth circuit pattern 251 may be formed by a general process of manufacturing a printed circuit board, such as an additive process, a subtractive process, a modified semi additive process (MSAP), a semi additive process (SAP), etc., and detailed descriptions thereof will be omitted herein.

Figure 8:
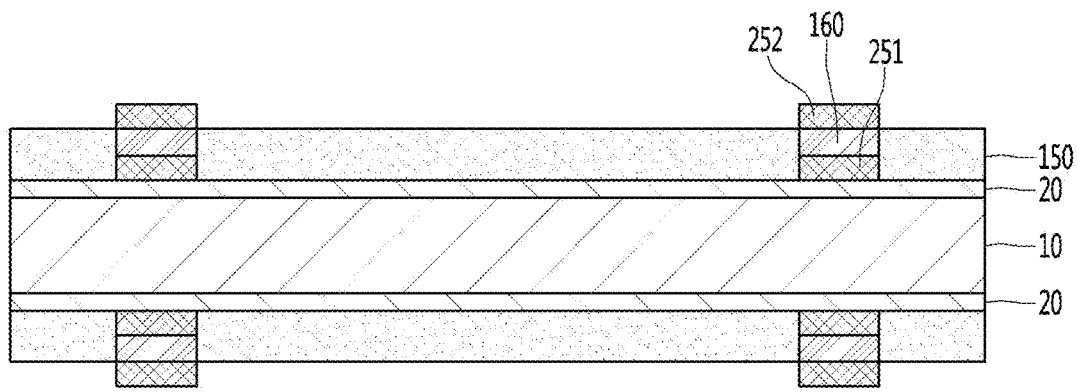

Next, referring to FIG. 8, an insulating layer is formed on the metal layer 20 on which the fifth circuit pattern 251 is formed. That is, a fifth insulating layer 150 may be formed on the metal layer 20 on which the fifth circuit pattern 251 is formed. In this case, a copper foil layer may be present on the fifth insulating layer 150.

The fifth insulating layer 150 may be formed of prepreg including glass fiber.

Preferably, the fifth insulating layer 150 may include glass or plastic. In detail, the first insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, a via 160 may be formed in the fifth insulating layer 150.

The via 160 may be formed by filling the inside of a through hole (not shown) passing through the fifth insulating layer 150 with a conductive material. The through hole may be formed by any one of mechanical, laser, and chemical processing. When the through hole is formed by mechanical processing, a method such as milling, drilling and routing may be used, when the through hole is formed by laser processing, a method of UV or $CO_2$ laser may be used, and when the through hole is formed by chemical processing, at least one insulating layer among the plurality of insulating layers may be opened by using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through hole is formed, the via 160 is formed by filling the inside of the through hole with a conductive material. The metal material forming the via 160 may be anyone selected from among copper (Cu), silver (Ag), tin (Sn), gold (Au), nickel (Ni), and palladium (Pd). The conductive material may be filled by any one of electroless plating, electrolytic plating, screen printing, sputtering, evaporation, ink jetting, and dispensing, or a combination thereof.

Next, when the via 160 is formed, a fifth circuit pattern 252 may be formed on an upper surface of the fifth insulating layer 150.

In this case, a process of forming the fifth insulating layer 150, the via 160, and the fifth circuit pattern 252 may be simultaneously performed on both sides of the carrier board CB.

Figure 9:
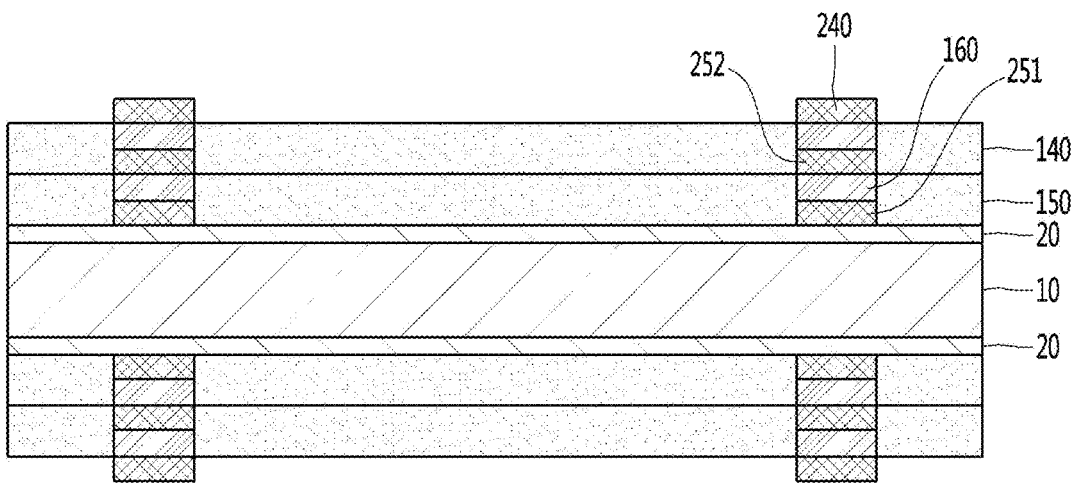

Next, referring to FIG. 9, a fourth insulating layer 140 is stacked on the fifth insulating layer 150. In addition, the via 160 is formed in the fourth insulating layer 140. In addition, a fourth circuit pattern 140 is formed on an upper surface of the fourth insulating layer 140. In this case, the fourth insulating layer 140 may be formed of a prepreg including the same glass fiber as the fifth insulating layer 150.

In this case, a process of forming the fourth insulating layer 140, the via 160, and the fourth circuit pattern 140 may be simultaneously performed on both sides of the carrier board CB.

Figure 10:
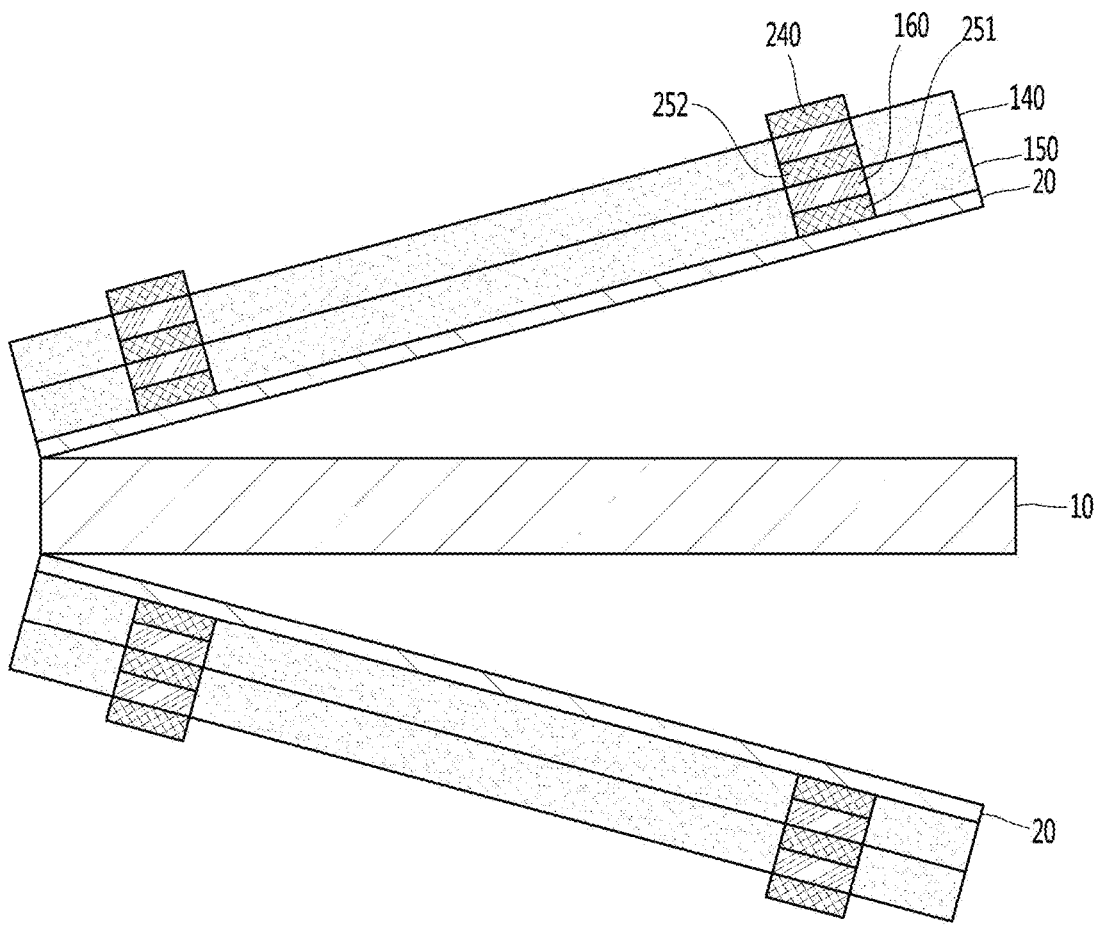

Next, referring to FIG. 10, a process of separating the fifth insulating layers respectively formed on upper and lower portions from the carrier board may be performed. That is, a first circuit board formed on the upper portion and a second circuit board formed on the lower portion may be separated from each other with respect to the carrier board. Accordingly, in the embodiment, a plurality of insulating parts may be simultaneously manufactured in a single process.

Figure 11:
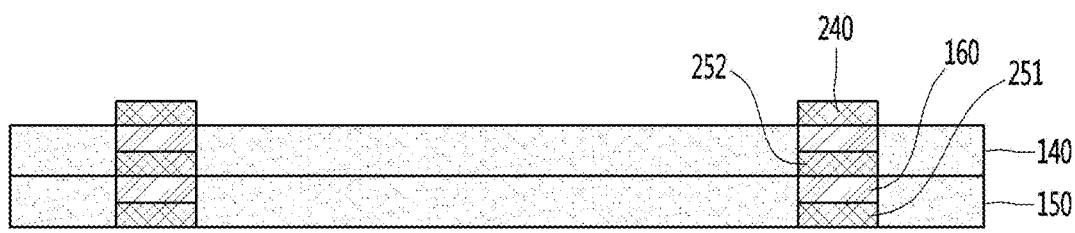

Next, referring to FIG. 11, the copper foil layer 20 may be removed from the mutually separated circuit board through a flash etching process.

Figure 3:
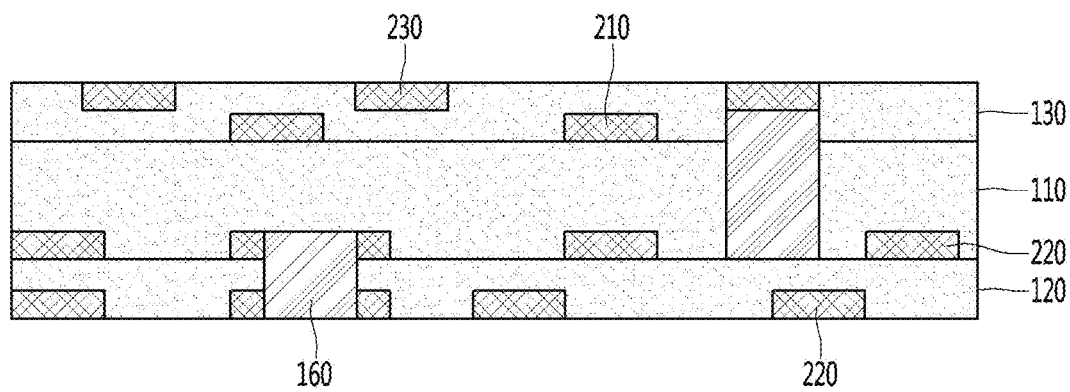
FIG. 3 is a view illustrating still another cross-sectional view of a circuit board according to an embodiment.
Figure 12:
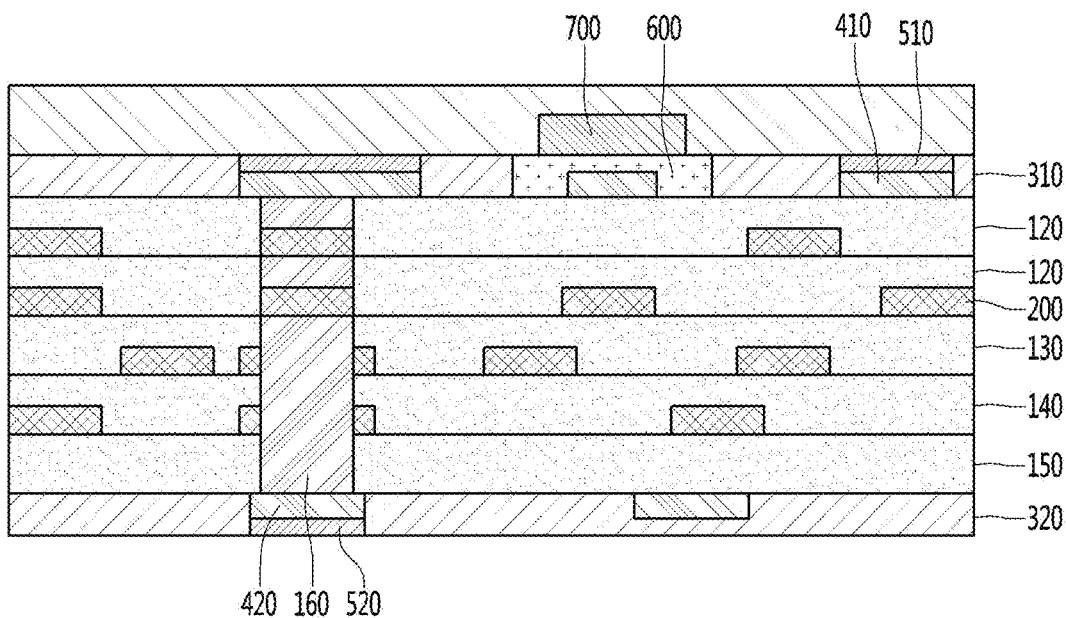

Next, referring to FIG. 12, a multilayer circuit board may be manufactured by stacking the circuit boards of FIGS. 1 to 3 described above on the first circuit board or the second circuit board including the prepreg.

That is, a multilayer circuit board may be manufactured by stacking first to third insulating layers including circuit patterns on the first circuit board or the second circuit board.

In this case, the first insulating layer 110, the second insulating layer 120, and the third insulating layer 130 may include a material different from that of the fourth insulating layer 140 and the fifth insulating layer 150.

For example, the first insulating layer 110, the second insulating layer 120, and the third insulating layer 130 may be a low dielectric layer having a low dielectric material having a dielectric constant of 3.0 or less, and the fourth insulating layer 140 and the fifth insulating layer 150 may be a high dielectric layer having a high dielectric material having a dielectric constant of 3.6 or more. That is, the circuit board according to another embodiment may include more low dielectric layers among a plurality of layers.

Alternatively, the thickness of the first insulating layer 110, the second insulating layer 120, and the third insulating layer 130 may be smaller than a thickness of the fourth insulating layer 140 and the fifth insulating layer 150. That is, the thickness of the first insulating layer 110, the second insulating layer 120, and the third insulating layer 130 including a low dielectric material may be smaller than the thickness of the fourth insulating layer 140 and the fifth insulating layer 150 including a high dielectric material. For example, the thickness of the first insulating layer 110, the second insulating layer 120, and the third insulating layer 130 may be about 70% to 85% of the thickness of the fourth insulating layer 140 and the fifth insulating layer 150.

In addition, the strength of the first insulating layer 110, the second insulating layer 120, and the third insulating layer 130 may be smaller than strength of the fourth insulating layer 140 and the fifth insulating layer 150. That is, the strength of the first insulating layer 110, the second insulating layer 120, and the third insulating layer 130 including a low dielectric material may be smaller than the strength of the fourth insulating layer 140 and the fifth insulating layer 150 including a high dielectric material.

In addition, the circuit pattern formed on the outermost insulating layer of the circuit board among the first insulating layer 110, the second insulating layer 120, and the third insulating layer 130 may be formed in the same buried pattern as the above-described embodiment. That is, the circuit pattern formed on the outermost insulating layer of the circuit board may be formed by forming a groove in the insulating layer and filling the groove with a circuit pattern material, instead of a process such as plating.

That is, the circuit board according to another embodiment may include a plurality of insulating layers having different dielectric constants, strengths, thicknesses, and curing characteristics.

Accordingly, since the plurality of insulating layers have a low dielectric constant, it is possible to reduce transmission loss according to the dielectric constant when transmitting a high frequency signal. In addition, it is possible to implement a thin circuit board by reducing the thickness of the insulating layer. Further, the plurality of insulating layers have a low dielectric constant and at the same time satisfies the strength, so that the reliability of the circuit board may be improved.

In addition, a photocurable insulating layer may be formed on the outermost layer of the circuit board to form the circuit pattern in a buried pattern. Therefore, it is possible to implement a fine pattern and reduce the thickness of the circuit board.

In addition, the fourth and fifth insulating layers formed on the carrier board are formed of a material having strength, and accordingly, it is possible to inhibit the insulating layers from being damaged when the insulating layers are separated from the carrier board, thereby improving the reliability of the circuit board.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that the contents related to such a combination and such a modification are included in the scope of the embodiments.

In addition, the above description has been focused on the embodiments, but it is merely illustrative and does not limit the present invention. Those skilled in the art to which the embodiments pertain may appreciate that various modifications and applications not illustrated above are possible without departing from the essential features of the embodiment. For example, each component particularly represented in the embodiments may be modified and realized. In addition, it should be construed that differences related to such a modification and an application are included in the scope of the present invention defined in the appended claims.

The invention claimed is:

1. A circuit board comprising:
a first insulating layer including one surface and an other surface opposite to the one surface;
a second insulating layer disposed on the one surface of the first insulating layer; and
a third insulating layer disposed on the other surface of the first insulating layer,
at least one via formed in at least one of the first insulating layer, the second insulating layer, and the third insulating layer;
a first passivation layer on the second insulating layer; and
a second passivation layer on the third insulating layer,
wherein a circuit pattern is disposed on at least one insulating layer of the first insulating layer to the third insulating layer,
wherein a first pad on which a chip is mounted is disposed on the second insulating layer,
wherein a second pad to which an external substrate is connected is disposed on the third insulating layer,
wherein the first insulating layer includes glass fiber,
wherein the second insulating layer that is independent from the first insulating layer includes a photocurable resin,
wherein the third insulating layer is independent from the first and second insulating layers,
wherein a thickness of the third insulating layer is 70% to 85% of a thickness of the first insulating layer,
wherein a dielectric constant of the second insulating layer is smaller than a dielectric constant of the first insulating layer,
wherein a dielectric constant of the third insulating layer is smaller than a dielectric constant of the first insulating layer and a dielectric constant of the second insulating layer, and
wherein a thickness of the third insulating layer is smaller than a thickness of the first insulating layer and a thickness of the second insulating layer.

2. The circuit board of claim 1, comprising:
a fourth insulating layer under the third insulating layer; and a fifth insulating layer under the fourth insulating layer,
wherein a dielectric constant of at least one of the first insulating layer to the fifth insulating layer is 3.0 or smaller than 3.0.

3. The circuit board of claim 2, wherein the first to fifth insulating layers include low dielectric layers having a dielectric constant of 3.0 or smaller than 3.0 and high dielectric layers having a dielectric constant greater than 3.6, and
a number of the low dielectric layers is greater than a number of the high dielectric layers.

4. The circuit board of claim 2, wherein the dielectric constant changes while extending from the fifth insulating layer toward the second insulating layer.

5. The circuit board of claim 2, wherein a thickness of at least one of the first to third insulating layers is 70% to 85% of a thickness of at least one of the fourth insulating layer and the fifth insulating layer.

6. The circuit board of claim 1, wherein the third insulating layer has a dielectric constant of 70% to 80% of the dielectric constant (Dk) of the first insulating layer and the second insulating layer.

7. The circuit board of claim 1, wherein a dielectric constant of the third insulating layer is 3.0 or smaller than 3.0.

8. The circuit board of claim 7, wherein a dielectric constant of the first insulating layer and the second insulating layer is in a range between 3.6 and 3.8.

9. The circuit board of claim 1, wherein a circuit pattern is disposed on the second insulating layer, and
the circuit pattern is formed to be buried in the second insulating layer.

10. The circuit board of claim 1, wherein the second insulating layer includes an acrylic resin, a photoinitiator, a silicon-based filler, and a hardener.

11. The circuit board of claim 1, wherein the second insulating layer is disposed on an outermost layer of the circuit board.

12. The circuit board of claim 1, wherein the second insulating layer and the third insulating layer do not include glass fiber, and wherein the first insulating layer includes prepreg.

* * * * *